United States Patent [19]
Gillespie, Jr.

[11] Patent Number: 5,973,924
[45] Date of Patent: *Oct. 26, 1999

[54] SYMMETRIC MULTI-PROCESSOR-PACKAGE DESIGN

[75] Inventor: Robert M. Gillespie, Jr., Albuquerque, N.Mex.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/711,014

[22] Filed: Sep. 9, 1996

[51] Int. Cl.⁶ ..................................................... H05K 7/10
[52] U.S. Cl. ......................... 361/735; 361/767; 324/755; 439/70; 439/160; 439/331
[58] Field of Search ..................................... 361/735, 767, 361/768, 783, 820; 324/755; 439/69, 70, 331, 160

[56] References Cited

U.S. PATENT DOCUMENTS 5,266,912 11/1993 Kledzik ..................................... 333/247
5,376,825 12/1994 Tukamoto et al. ....................... 361/735
5,384,692 1/1995 Jaff .......................................... 361/735
5,559,445 9/1996 Eaddy et al. ............................. 324/755
5,602,719 2/1997 Kinion ..................................... 361/704

*Primary Examiner*—Leo P. Picard
*Assistant Examiner*—John B. Vigushin
*Attorney, Agent, or Firm*—Blakely, Sokoloff, Taylor & Zafman LLP

[57] ABSTRACT

An integrated circuit package assembly that allows an integrated circuit package to be plugged into another integrated circuit package that is mounted to a printed circuit board. The assembly includes a first integrated circuit package assembly that is mounted to the printed circuit board. The first assembly includes a first integrated circuit package that contains a plurality of holes on the top surface of the package. The mating pins of a second integrated circuit package assembly can be plugged into the holes to couple the second assembly to the first assembly. The second integrated circuit package assembly can be added without occupying additional board space on the printed circuit board.

8 Claims, 1 Drawing Sheet

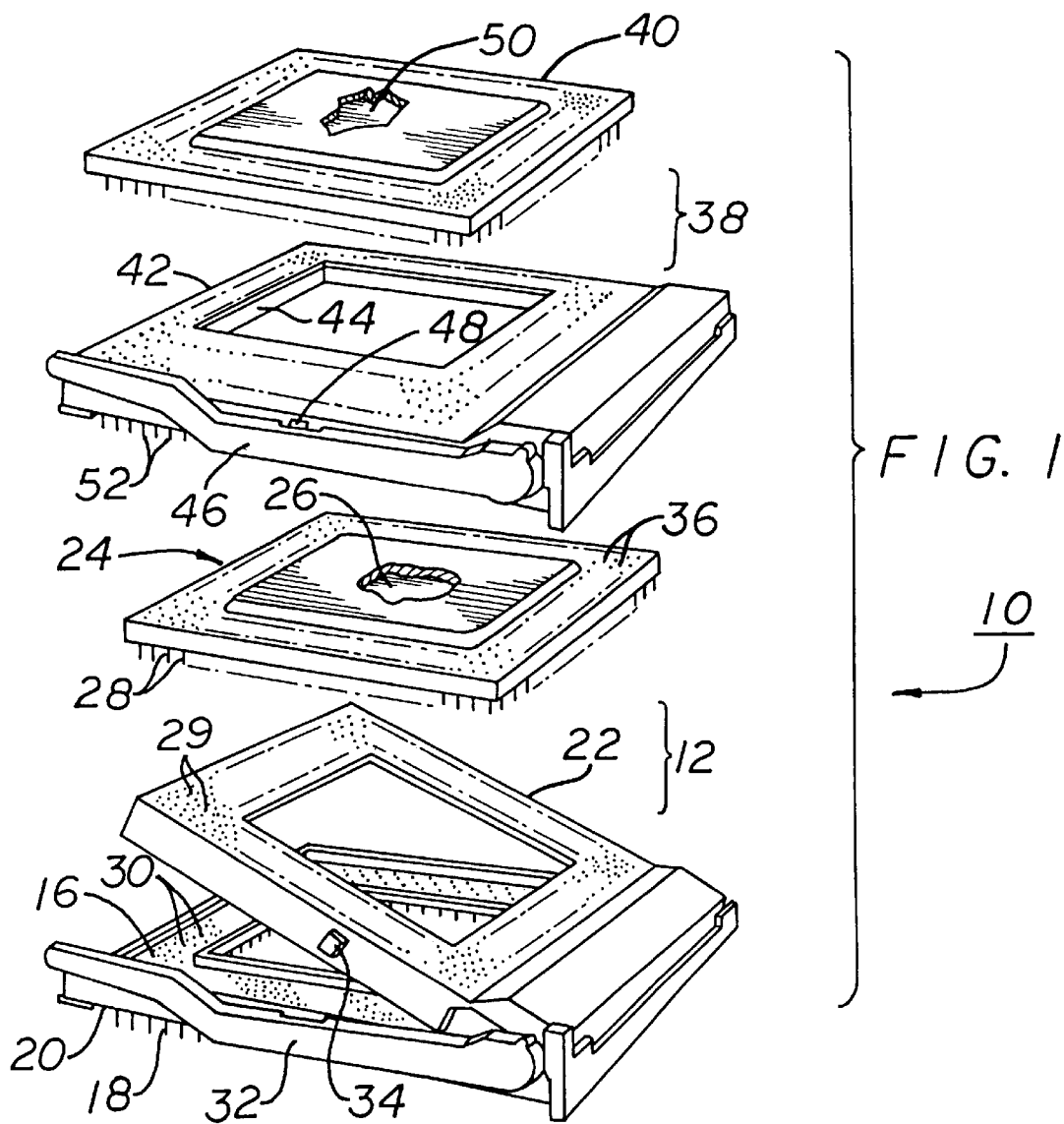
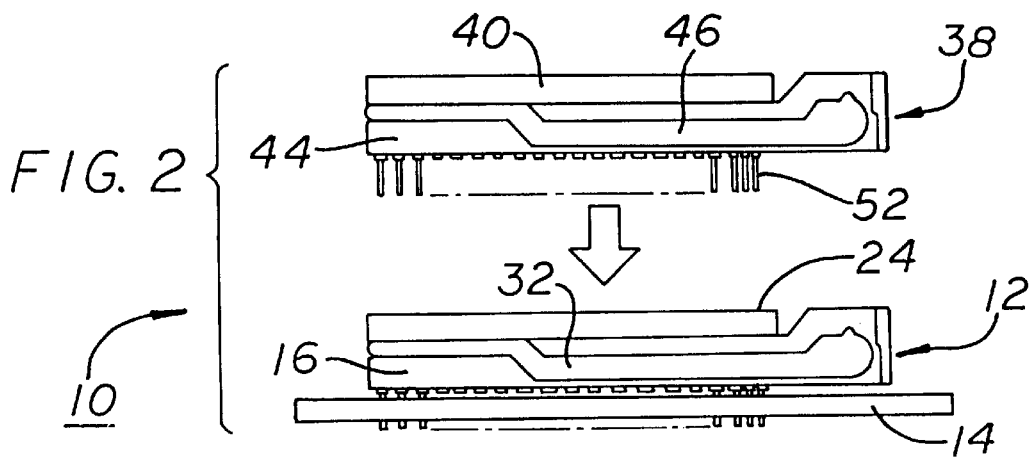

SYMMETRIC MULTI-PROCESSOR-PACKAGE DESIGN

BACKGROUND OF THE INVENTION

1. Field of the Invention

The present invention relates to an integrated circuit package assembly.

2. Description of Related Art

Integrated circuits are typically housed within a package that is mounted to a printed circuit board. The integrated circuit (IC) package may have contacts that are soldered to the circuit board and electrically coupled to the integrated circuit by internal routing within the package.

It is sometimes desirable to upgrade a computer system by replacing the existing circuitry with a different chip. In some systems replacing the integrated circuit of a mounted IC package requires a solder reflow machine to remove the package. Most end users do not have access to a solder reflow machine. Consequently the entire printed circuit board assembly must be replaced to upgrade the system.

There have been developed integrated circuit packages which allow an end user to remove and plug in a new device. The packages typically have a socket that is soldered to the printed circuit board. The socket contains a plurality of individual sockets that receive the pins of an integrated circuit package. The socket electrically couples the integrated circuit package to the printed circuit board. The replaceable pin packages are commonly referred to as zero insertion force (ZIF) packages.

The integrated circuit package of a ZIF device is attached to a cover plate that is pivotally connected to the socket. The assembly has a cam lever that can be rotated by an end user to pull the pins of the package out of the socket. The end user can then remove the existing package and load a new integrated circuit package into the cover plate. The cover plate is rotated so that the pins of the new package are pressed into the socket to couple the integrated circuit to the printed circuit board.

Integrated circuit packages are typically mounted across the surface of a printed circuit board so that each package occupies a predetermined amount of board space. Adding another integrated circuit package requires additional space on the printed circuit board. It would be desirable to provide an integrated circuit package assembly that allows an additional package to be added to a printed circuit board without occupying additional space on the board.

SUMMARY OF THE INVENTION

The present invention is an integrated circuit package assembly that allows an integrated circuit package to be plugged into another integrated circuit package that is mounted to a printed circuit board. The assembly includes a first integrated circuit package assembly that is mounted to the printed circuit board. The first assembly includes a first integrated circuit package that contains a plurality of holes on the top surface of the package. The mating pins of a second integrated circuit package assembly can be plugged into the holes to couple the second assembly to the first assembly. The second integrated circuit package assembly can be added without occupying additional board space on the printed circuit board.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 1 is a perspective view of an integrated circuit package assembly of the present invention;

FIG. 2 is a side view showing a second integrated circuit package assembly being mounted to a first integrated circuit package assembly that is mounted to a printed circuit board.

DETAILED DESCRIPTION OF THE INVENTION

Referring to the drawings more particularly by reference numbers, FIGS. 1 and 2 show a printed circuit board package assembly 10 of the present invention. The assembly 10 allows one integrated circuit package to be mounted to another integrated circuit package without requiring any additional space on a printed circuit board.

The assembly 10 includes a first integrated circuit package assembly 12 that is mounted to a printed circuit board 14. The first integrated circuit package assembly 12 is preferably a modified version of an existing assembly commonly referred to as a zero insertion force (ZIF) package 12. The ZIF package 12 includes a socket 16 which has a plurality of pins 18 that extend from a bottom surface 20 of the assembly 12. The pins 18 are soldered to the printed circuit board 14. The ZIF package 12 also contains a cover plate 22 that is pivotally connected to the socket 16.

Attached to the cover plate 22 is a first integrated circuit package 24. The package 24 contains a first integrated circuit 26 that is electrically coupled to a plurality of external pins 28 by internal routing within the package 24. The package 24 can be constructed from any known packaging processes, including but not limited to, co-fired ceramic, molded plastic or printed circuit board packaging processes. The integrated circuit package 24 is typically mounted to the cover plate 22 by inserting the pins 28 through corresponding holes 29 of the plate 22. An end user can readily replace the existing package 24 with a new integrated circuit package by pulling the pins 28 out of the holes 29.

When the cover plate 22 is rotated in a downward direction the pins 28 of the package 24 are pressed into corresponding individual sockets 30 of the socket 16. The socket 16 electrically couples the pins 28, the package 24 and the integrated circuit 26 to the printed circuit board 14. The first ZIF package 12 may further contain a lever 32 that cooperates with a cam portion 34 of the cover plate 22 to rotate the cover plate 22 away from the socket 16 and detach the pins 28 from the pin sockets 30.

The first integrated circuit package 24 has a plurality of holes 36 that allow a second integrated circuit package assembly 38 to be mounted to the first integrated circuit package assembly 12. The second assembly 38 may be of similar construction as the first ZIF package assembly 12. The second assembly 38 may include a second integrated circuit package 40 which is attached to a cover plate 42 and plugged into a socket 44. The second package 40 may be unplugged from the socket 44 by rotating a second lever 46 which engages a cam portion 48 of the cover plate 42. The second integrated circuit package 40 contains a second integrated circuit 50.

The socket 44 of the second assembly 38 may have a plurality of pins 52 that are inserted into the holes 36 of the first integrated circuit package 24. The holes 36 typically contain plated through holes and corresponding pin sockets that secure the pins 52, and electrically couple the second integrated circuit package 40 to the first package 24. The holes 36 may contain through routing which directly route the second integrated circuit 50 to the printed circuit board 14. The holes 36 may also contain routing that electrically couple the second integrated circuit 50 to the first integrated circuit 26.

In operation, the first ZIF package 12 is typically mounted to the printed circuit board 14 by initially soldering the pins 18 to the board 14. The first package 24 is then mounted to the cover plate 22 and pushed into the socket 16. The second assembly 38 may then be coupled to the first assembly 12 by pushing the pins 52 into the holes 36 of the first package 24.

The present invention allows an end user of a computer product to easily upgrade the product with another integrated circuit without occupying more space on the printed circuit board 14. By way of example, the first integrated circuit 26 may be microprocessor. The second integrated circuit 50 may be a parallel microprocessor, a co-microprocessor, cache memory, or any other auxiliary device that is added to the system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package assembly, comprising:
   a printed circuit board;
   a first integrated circuit package assembly that is mounted to said printed circuit board and includes a first integrated circuit package that is attached to a first cover plate that rotates relative to a first socket that is attached to said printed circuit board, said first integrated circuit package being moved from an inserted position to a released position by a first cam lever; and,
   a second integrated circuit package assembly that is plugged into said first integrated circuit package assembly.

2. The assembly as recited in claim 1, wherein said first integrated circuit package assembly includes a plurality of first pins that are attached to said printed circuit board.

3. The assembly as recited in claim 2, wherein said second integrated circuit package assembly includes a plurality of second pins that are inserted into a plurality of holes in said first integrated circuit package assembly.

4. The assembly as recited in claim 1, wherein said second integrated circuit package assembly includes a second integrated circuit package that is attached to a second cover plate that rotates relative to a second socket that is attached to said first integrated circuit package, said second integrated circuit package being moved from an inserted position to a released position by a second cam lever.

5. An integrated circuit package assembly, comprising:
   a printed circuit board;
   a first socket that is mounted to said printed circuit board, said first socket having a plurality of individual sockets;
   a first cover plate that is pivotally connected to said first socket;
   a first integrated circuit package that is attached to said first cover plate, said first integrated circuit package having a plurality of pins that are inserted into said individual sockets of said first socket, said first integrated circuit package having a top surface that contains a plurality of holes;
   a first cam lever which rotates said first cover plate to move said first integrated circuit package from an inserted position to a released position;
   a second socket that is attached to said holes of said first integrated circuit package, said second socket having a plurality of individual sockets;
   a second cover plate that is pivotally connected to said second socket;
   a second integrated circuit package that is attached to said cover plate, said second integrated circuit package having a plurality of pins that are inserted into said individual sockets of said second socket; and,
   a second cam lever which rotates said second cover plate to move said second integrated circuit from an inserted position to a released position.

6. The assembly as recited in claim 5, wherein said first integrated circuit package contains a first integrated circuit that is electrically coupled to a second integrated circuit located within said second integrated circuit package.

7. A zero insertion force integrated circuit package assembly, comprising:
   a socket that has a plurality of pins that are coupled to a plurality of individual sockets;
   a cover plate that is pivotally connected to said socket;
   an integrated circuit package that is attached to said cover plate, said integrated circuit package having a plurality of pins that are inserted into said individual sockets of said socket, said integrated circuit package having a top surface that contains a plurality of holes; and,
   a cam lever which rotates said cover plate to move said integrated circuit package from an inserted position to a released position.

8. The assembly as recited in claim 7, wherein said integrated circuit package contains an integrated circuit that is electrically coupled to said pins of said integrated circuit package.

* * * * *